United States Patent
Baseman et al.

(10) Patent No.: US 8,793,106 B2
(45) Date of Patent: Jul. 29, 2014

(54) CONTINUOUS PREDICTION OF EXPECTED CHIP PERFORMANCE THROUGHOUT THE PRODUCTION LIFECYCLE

(75) Inventors: Robert J. Baseman, Brewster, NY (US); Amit Dhurandhar, Yorktown Heights, NY (US); Sholom M. Weiss, Yorktown Heights, NY (US); Brian F. White, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 13/242,692

(22) Filed: Sep. 23, 2011

(65) Prior Publication Data

US 2013/0080125 A1    Mar. 28, 2013

(51) Int. Cl.
    *G06F 7/60*    (2006.01)

(52) U.S. Cl.
    USPC ........ 703/2; 703/3; 703/4; 700/291; 700/100; 700/30; 700/97; 700/29; 716/106; 716/50; 716/136

(58) Field of Classification Search
    None
    See application file for complete search history.

(56) References Cited

U.S. PATENT DOCUMENTS

| | | | |
|---|---|---|---|
| 6,917,849 B1 * | 7/2005 | Pasadyn et al. | 700/121 |
| 7,144,297 B2 * | 12/2006 | Lin et al. | 451/5 |
| 7,260,516 B2 * | 8/2007 | Chatfield et al. | 703/14 |
| 7,644,385 B1 * | 1/2010 | Boyle et al. | 716/138 |
| 8,090,464 B2 * | 1/2012 | Bomholt et al. | 700/121 |
| 2005/0095774 A1 * | 5/2005 | Ushiku et al. | 438/222 |
| 2006/0252348 A1 * | 11/2006 | Lin et al. | 451/5 |
| 2008/0034337 A1 * | 2/2008 | Kuemerle et al. | 716/6 |
| 2009/0093904 A1 * | 4/2009 | Baseman et al. | 700/110 |
| 2010/0017009 A1 * | 1/2010 | Baseman et al. | 700/109 |
| 2010/0145646 A1 * | 6/2010 | Baseman et al. | 702/81 |
| 2011/0130861 A1 * | 6/2011 | Miwa et al. | 700/121 |
| 2011/0166688 A1 * | 7/2011 | Moyne et al. | 700/104 |
| 2013/0071957 A1 * | 3/2013 | Wang et al. | 438/17 |

* cited by examiner

*Primary Examiner* — Omar Fernandez Rivas
*Assistant Examiner* — Cuong Luu
(74) *Attorney, Agent, or Firm* — Scully, Scott, Murphy & Presser, P.C.; Daniel P. Morris, Esq.

(57) ABSTRACT

A system, method and computer program product for predicting at least one feature of at least one product being manufactured. The system receives, from at least one sensor installed in equipment performing one or more manufacturing process steps, at least one measurement of the feature of the product being manufactured. The system selects one or more of the received measurement of the feature of the product. The system estimates additional measurements of the feature of the product at a current manufacturing process step. The system creates a computational model for predicting future measurements of the feature of the product, based on the selected measurement and the estimated additional measurements. The system predicts the future measurements of the feature of the product based on the created computational model. The system outputs the predicted future measurements of the feature of the product.

25 Claims, 10 Drawing Sheets

| Field | # unique | # missing | min | max | avg | std | Cv | # outliers at 4 stds | Fraction missing |
|---|---|---|---|---|---|---|---|---|---|
| LOT_ID | 907 | 0 | | | | | | | 0% |
| WAFER_ID | 6435 | 0 | | | | | | | 0% |
| Measurement 1 | 44 | 6236 | 813 | 855 | 832.09 | 6.85 | 0.01 | None | 94% |
| Measurement 2 | 57 | 5768 | 0.01 | 0.10 | 0.10 | 0.00 | 0.03 | 1 | 87% |
| Measurement 3 | 47 | 6267 | 1.32 | 2.07 | 1.78 | 0.08 | 0.05 | 2 | 94% |
| Measurement 4 | 26 | 6615 | 775 | 947 | 806.36 | 29.98 | 0.04 | 1 | 99% |
| ⋮ | ⋮ | ⋮ | ⋮ | ⋮ | ⋮ | ⋮ | ⋮ | ⋮ | ⋮ |
| Measurement n | 20 | 6531 | 34.1 | 36 | 35.08 | 0.40 | 0.01 | None | 98% |

FIG. 8

| Wafers | Test Sample 1 | Test Sample 2 | Sample 3 |
|---|---|---|---|
| Wafers | 174 | 51 | 118 |
| Number high (above 12.24 mean) | 150 | 46 | |
| Fraction high (above 12.24 mean) | 86% | 90% | |
| Average measurement | 13.02 | 13.17 | |
| Total Sample 3 wafers with test results | | | 77 |
| Number high (above 12.24 mean) | | | 70 |
| Fraction high (above 12.24 mean) | | | 91% |
| Average of high Sample 3 wafers | | | 13.57 |

FIG. 9

| | | | |
|---|---|---|---|
| Mean of M1 test set | 10.74 | | |
| StdDev of M1 test set | 0.46 | | |
| Assuming M1 PSRO window is from | 10 to 11.3 | | |
| | Fraction of wafers falling outside of M1 PSRO target window | Reduction in loss | Fraction of test wafers included in model interval |
| Choosing wafers randomly | 15.4% | | |
| Choosing wafers in prediction interval 1 | 3.2% | 79% | 13.0% |
| Choosing wafers in prediction interval 2 | 6.3% | 59% | 31.0% |
| Choosing wafers in prediction interval 3 | 7.5% | 51% | 45.0% |

CONTINUOUS PREDICTION OF EXPECTED CHIP PERFORMANCE THROUGHOUT THE PRODUCTION LIFECYCLE

BACKGROUND

The present application generally relates to manufacturing of semiconductor products. More particularly, the present application relates to predicting measurement values of features of the semiconductor products being manufactured.

A semiconductor chip or wafer (i.e. a collection of semiconductor chips) takes about three months to manufacture. While manufacturing the semiconductor chip or wafer, thousands of measurements are obtained, from sensors attached to manufacturing equipment, to monitor quality of the semiconductor chip or wafer being manufactured. At each manufacturing step, 5% or 10% of total wafers being processed in the manufacturing step are sampled to obtain the measurements (e.g., area, yield rate, speed, etc.). A manufacturing step of a semiconductor chip or wafer includes, but is not limited to performing: deposition, etching, lithography, doping, etc.

Under current solutions, a user cannot determine whether that semiconductor chip or wafer being manufactured is going to result in a semiconductor chip or wafer that is in compliance with its product or performance specification, or a semiconductor chip or wafer not complying with its product or performance specification.

As knowledge about potential issues relating to a product being manufactured, while it is being manufactured, is advantageous for quality control purposes, it would be highly desirable to be able to generate or obtain predictions of future measurements of a product currently being manufactured, as it is being manufactured, so as to better assess that product's ultimate performance related metric and viability for commercial use.

SUMMARY

The present disclosure describes a system, method and computer program product for predicting at least one feature of at least one product being manufactured.

In one embodiment, there is provided a system for predicting at least one feature of at least one product being manufactured. The system receives, from at least one sensor installed in at least one equipment performing one or more manufacturing process steps, at least one measurement of the at least one feature of the at least one product being manufactured. The system selects one or more of the at least one received measurement of the at least one feature of the at least one product. The system estimates additional measurements of the at least one feature of the at least one product at a current manufacturing process step. The system creates a computational model for predicting future measurements of the at least one feature of the at least one product, based on the selected measurement and the estimated additional measurements. The system predicts the future measurements of the at least one feature of the product based on the created computational model. The system outputs the predicted future measurements of the at least one feature of the at least one product.

In a further embodiment, the at least one received measurement of the at least one feature of the at least one product includes one or more of: a speed measurement of the at least one product, a power consumption measurement of the at least one product, a yield rate measurement of the at least one product, a leakage current measurement of the at least one product, an area measurement of the at least one product, a capacitance measurement of the at least one product, and a resistance measurement of the at least one product.

In a further embodiment, the at least one product being manufactured includes one or more of: a semiconductor chip, a semiconductor wafer, and a semiconductor wafer lot.

In a further embodiment, the computing system obtains estimates of the additional measurements of the at least one feature of the at least one product by computing average values or mean values of the at least one received measurement of the at least one feature of other similar or same products.

In a further embodiment, to create the computational model, the system applies a regression technique or machine learning technique to the selected measurement and the estimated additional measurements.

In a further embodiment, the system performs the step of receiving, the step of selecting, the step of estimating, the step of creating, the step of predicting and the step of outputting, in real-time at one or more manufacturing process step.

In a further embodiment, the system sets thresholds for distinguishing a specification compliant (i.e. normal) product, a slow product or a fast product. The system characterizes the product as the normal product, the slow product, or the fast product, according to the set thresholds. The system optimizes the step of setting and the step of characterizing. The system notifies a user of the predicted future measurements of the product, if the product is characterized as the slow product or the fast product.

In a further embodiment, the computing system updates the created computational model whenever the computing system receives a new measurement of the at least one feature of the at least one product, and the computing system updates the prediction of the future measurements of the at least one feature of the product according to the updated computational model.

In a further embodiment, the system updates the created computational model every pre-determined time period, and system updates the prediction of the future measurements of the at least one feature of the product every pre-determined time period according to the updated computational model.

In a further embodiment, the system determines a time interval in which the created computational model computes the future measurements of the at least one feature of the at least one product with accuracy.

In a further embodiment, to determine the time interval, the system compares two or more time intervals in which the created computational model computes the future measurements. The system compares accuracies of the computed future measurements of the two or more time intervals. The system selects an interval whose accuracy is greatest among the two or more time intervals.

BRIEF DESCRIPTION OF THE DRAWINGS

The accompanying drawings are included to provide a further understanding of the present invention, and are incorporated in and constitute a part of this specification.

FIG. 8 illustrates exemplary measurements of products being manufactured in one embodiment.

FIG. 9 illustrates a table that demonstrates an ability to predict, with accuracy, a group of products whose speed is going to be faster than a threshold in one embodiment.

FIG. 10 illustrates a table that demonstrates an ability to determine a best time interval during which future measurements of a feature of a product being manufactured is going to be predicted.

DETAILED DESCRIPTION

Figure 4A:
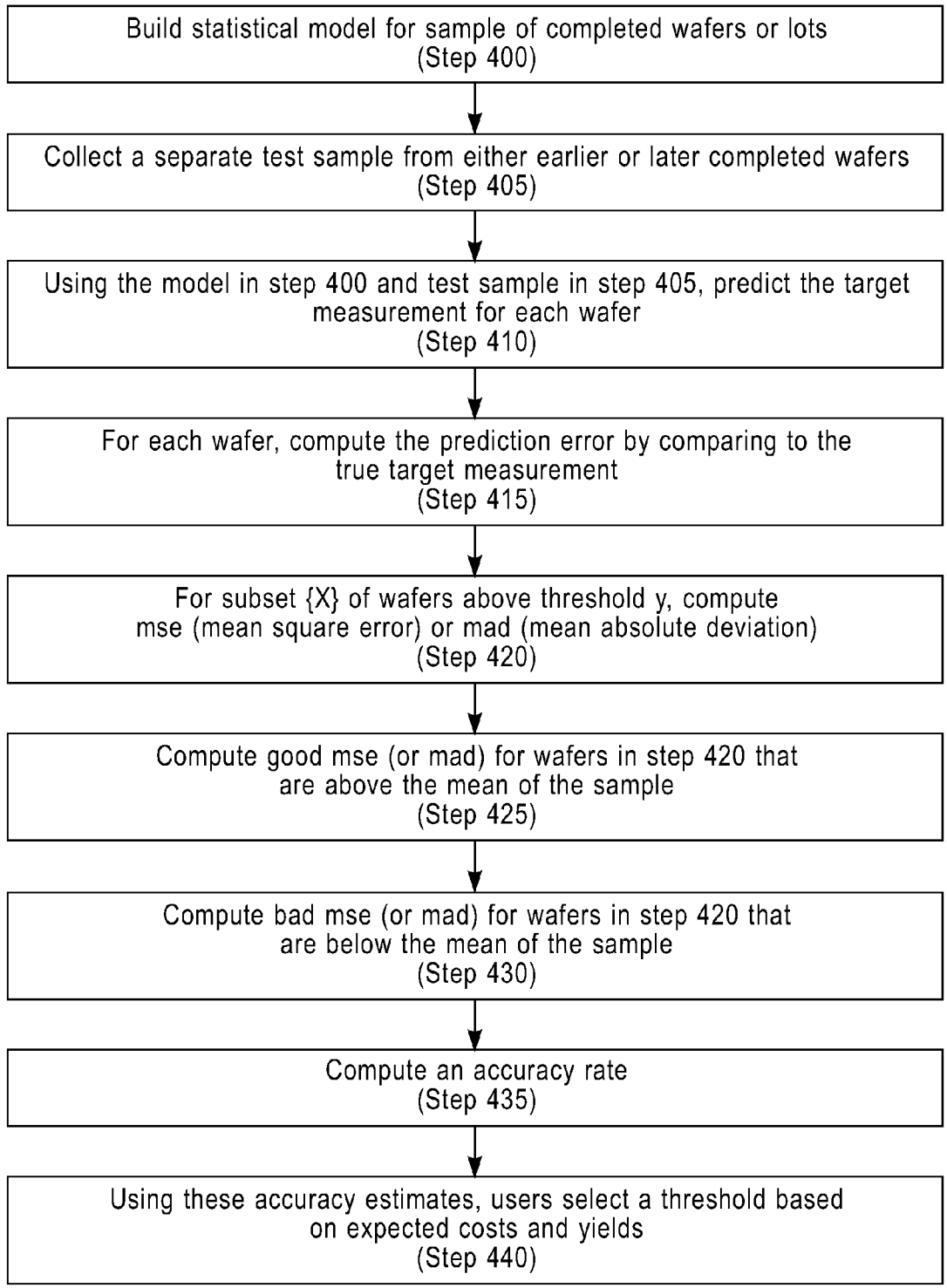
FIG. 4a is a flow chart that describes method steps for determining a threshold(s) to evaluate whether a predicted speed of a product being manufactured is fast in one embodiment.
Figure 4B:
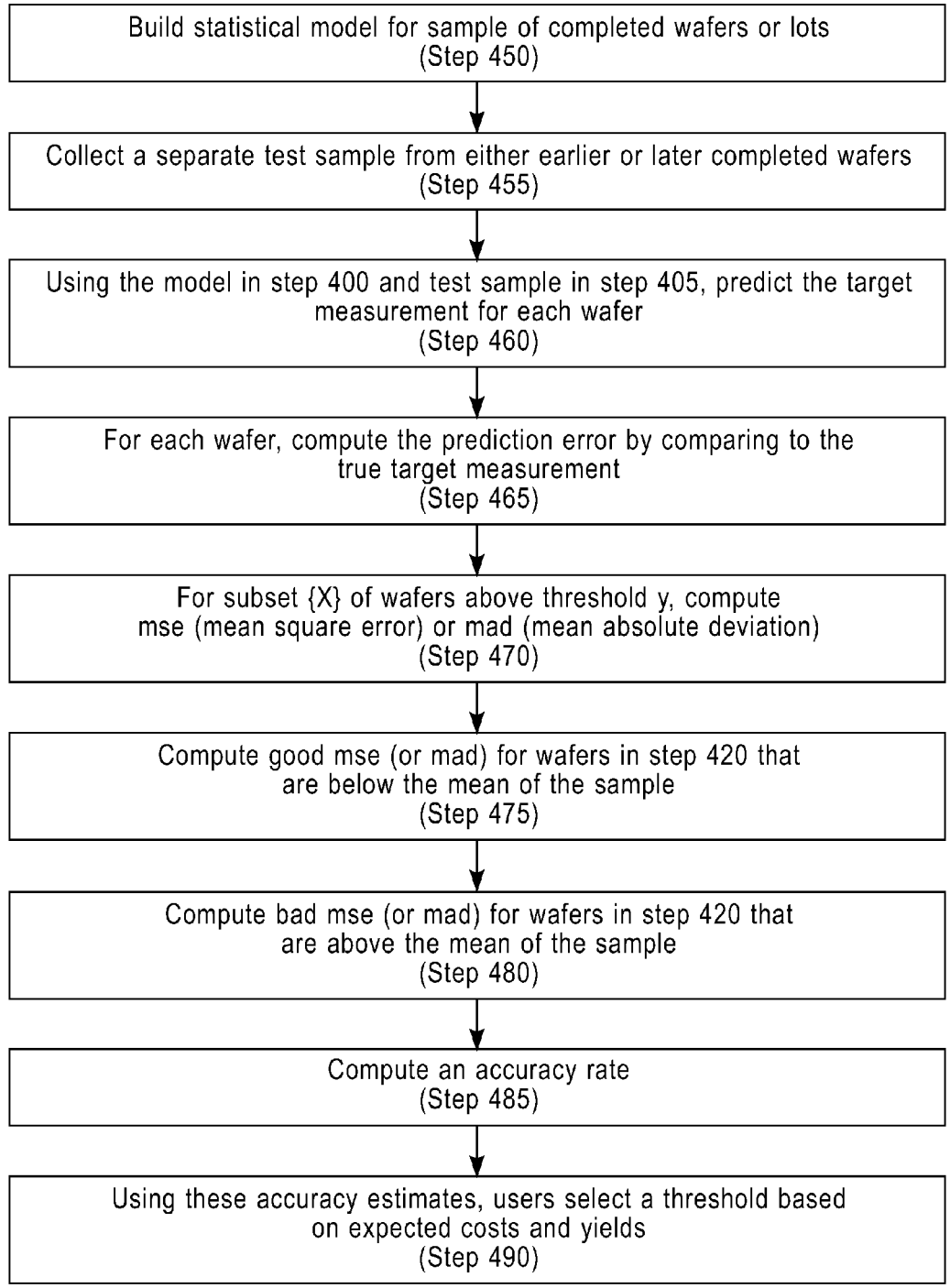
FIG. 4b is a flow chart that describes method steps for determining a threshold(s) to evaluate whether a predicted speed of a product being manufactured is slow in one embodiment.
Figure 5:
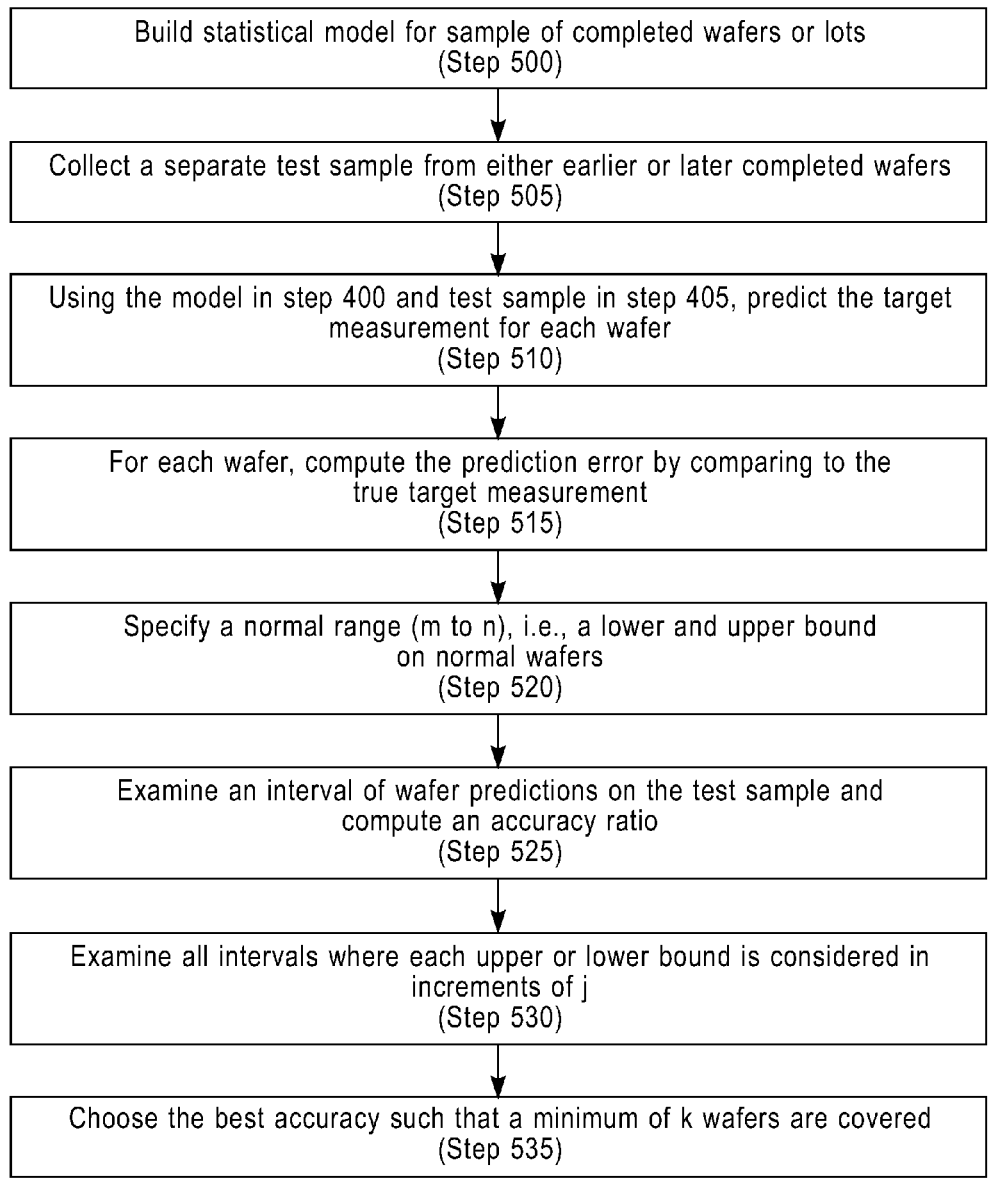
FIG. 5 is a flow chart that describes method steps for determining a threshold(s) to evaluate whether a predicted speed of a product being manufactured is normal in one embodiment.
Figure 6:
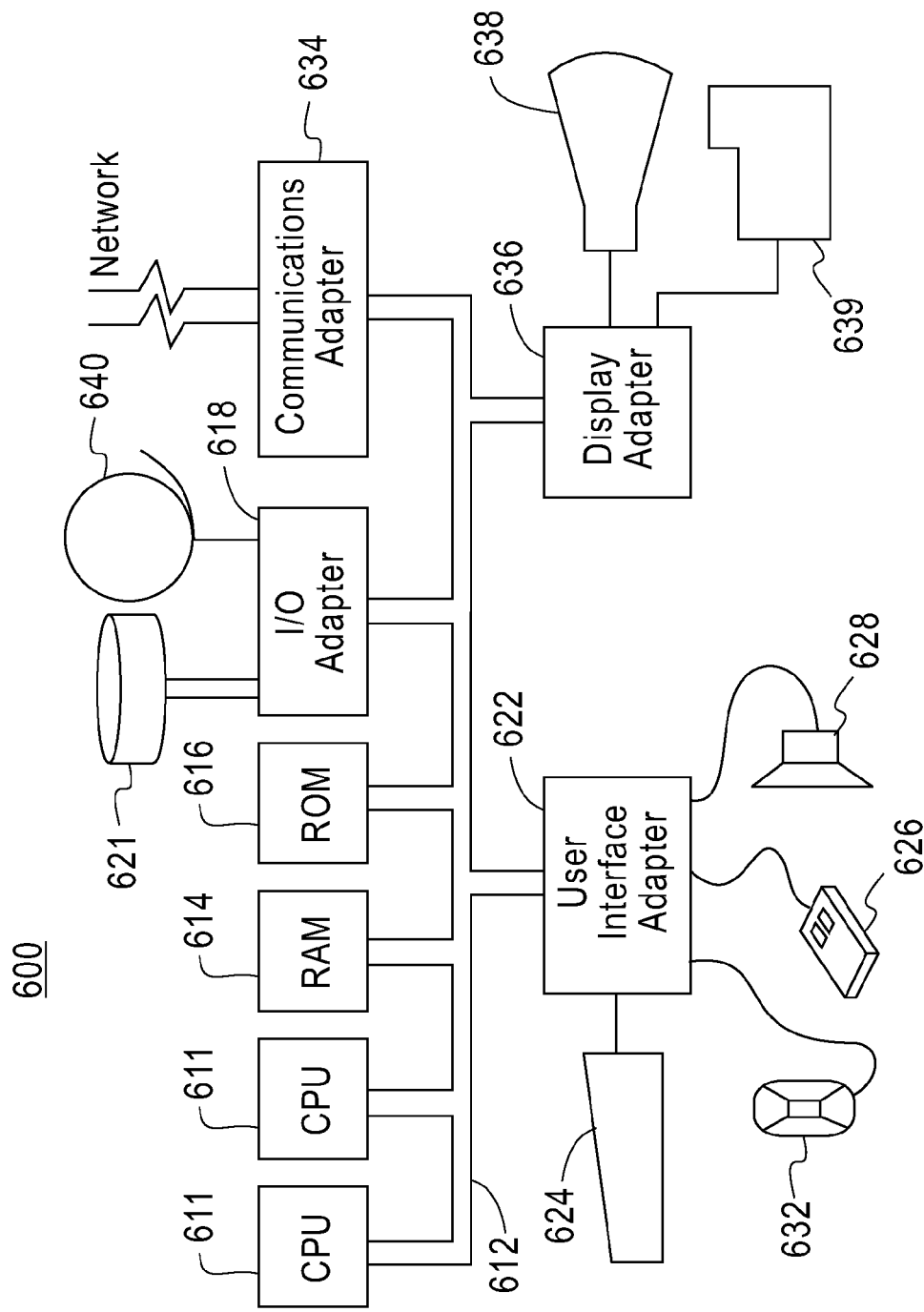
FIG. 6 illustrates exemplary hardware configuration to run the method steps shown in FIGS. 1-5 in one embodiment.

FIG. 6 illustrates an exemplary hardware configuration of a computing system 600 that runs the method steps described in FIGS. 1-5. The hardware configuration preferably has at least one processor or central processing unit (CPU) 611. The CPUs 611 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface device to the bus 612), a communication adapter 634 for connecting the system 600 to a data processing network, the Internet, an Intranet, a local area network (LAN), etc., and a display adapter 636 for connecting the bus 612 to a display device 638 and/or printer 639 (e.g., a digital printer of the like).

The computing system 600 accurately (e.g., more than 85% accuracy) predicts performance metrics (e.g., speed, power consumption, etc.) of a product being manufactured at every stage in its manufacturing process, before these metrics are known or can be measured, e.g., by a sensor associated with a manufacturing machine or manufacturing process step.

Advantages of predicting at least one measurement of the feature of the product being manufactured, before the product is fully manufactured, include, but are not limited to:

(1) Fix products whose predicted performances deviate from their product specification while manufacturing those products;
(2) Arrange products according to expected performance and current demand; and
(3) Arrange products for each customer based on his/her required product specification.

Figure 1:
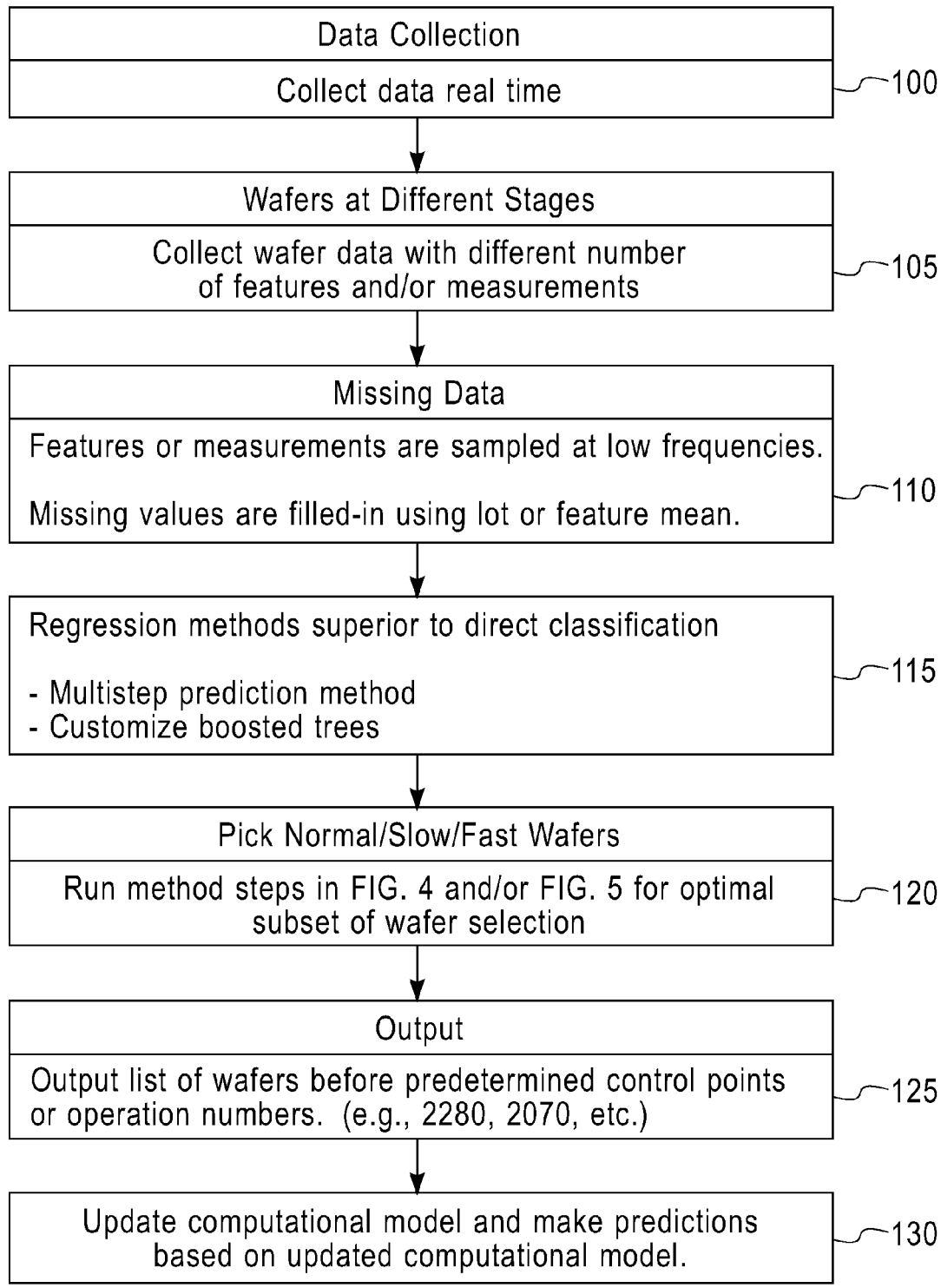
FIG. 1 is a flow chart that describes method steps for predicting at least one feature of at least one product being manufactured in one embodiment.

FIG. 1 is a flow chart that describes method steps for predicting at least one feature (e.g., speed, area, etc.) of at least one product being manufactured in one embodiment. In one embodiment, the product being manufactured includes one or more of: a semiconductor chip, a semiconductor wafer, and a semiconductor wafer lot. At step 100, the computing system 600 receives, from at least one sensor installed in or operating in conjunction with at least one equipment performing one or more manufacturing process steps, at least one measurement of the feature of the product being manufactured. The feature of the product includes, but is not limited to: a speed of the product (e.g., a clock or oscillator frequency), a power consumption of the product, a yield rate of the product, a leakage current of the product, a capacitance of the product, a resistance of the product, etc. The received real-time measurement of the feature of the product includes, but is not limited to: a speed measurement (e.g., a clock frequency, an oscillator signal output, a logic delay time, etc.) of the product, a power consumption measurement of the product, a yield rate measurement of the product, a leakage current measurement of the product, an area measurement of the product, a capacitance measurement of the product, and a resistance measurement of the product. The computing system 600 stores the received measurements, e.g., in a database (not shown). In one embodiment, the computing system 600 evaluates quality of the received measurement, e.g., by applying at least one known statistical test (e.g., T-test, etc.) on the received measurement.

Returning to FIG. 1, at step 105, the computing system 600 selects one or more of the received measurement of the feature of the product being manufactured. In one embodiment, a different measurement of the feature of the product being manufactured is taken at each different manufacturing process step. While a product is being manufactured up to a certain manufacturing process step, there may be multiple (e.g., 100) different sensors activated that measure features of the product. Then, the product may have a sub-set of (e.g., at least 80) of different measurements obtained from the sensors. Other products may have fewer different measurements (e.g., less than 10) obtained from the sensors at the same or different manufacturing process step.

FIG. 8 is a table 800 that specifies exemplary measurements of features of products being manufactured at a semiconductor manufacturing plant for a particular lot and wafer ID manufactured. For example, a "measurement 1" 810 (e.g., leakage current measurement) is obtained for "44" number of products being manufactured 815 but are not obtained for "6236" number of same or similar products being manufactured 820. Thus, 94% of total products being manufactured 825 did not have the "measurement 1" data. A "measurement 3" 830 (e.g., power consumption measurement) is obtained for "47" number of products being manufactured 835 but are not obtained for "6267" number of same or similar products being manufactured 840. Thus, 94% of total products being manufactured 845 did not have the "measurement 3" data. Note that, in this exemplary embodiment, as indicated in the "Fraction Missing" column 850, more than 90% of total products being manufactured do not have each measurement. However, the computing system 600 is able to make predictions of measurements of the feature of the product being manufactured, e.g., by running method steps in FIG. 1, even though more than 90% of total products being manufactured do not have a corresponding measurement.

Returning to FIG. 1, at step 110, the computing system 600 estimates additional measurements of the feature of the product at a current manufacturing process step. For example, assume that a first product being manufactured does not have a measurement of a leakage current. However, if other similar or identical product(s) being manufactured or already manufactured have available leakage current measurements at the current manufacturing process step, then the computing system additionally estimates the leakage current measurement of the first product. In one embodiment, the leakage current measurement estimate of the first product is obtained, e.g., by averaging the leakage current measurements of the other similar or identical products, or by calculating a mean value of the leakage current measurements of the other similar or same products.

At step 115, the computing system 600 creates a computational model for predicting future measurements of the product being manufactured, based on the selected measurement and the estimated additional measurements. In one embodiment, the computing system creates the computational model, e.g., by applying a regression technique (e.g., a linear regression, etc.) or a machine learning technique (e.g., an unsupervised learning, etc.) to the selected measurement and the estimated missing measurements. The system predicts the future measurements of the feature of the product using the created computational model. The system outputs the predicted future measurements of the product being manufactured. In one embodiment, the created computational model is used in performing a multi-step prediction or customized boosted tree prediction.

Figures 2, 3:
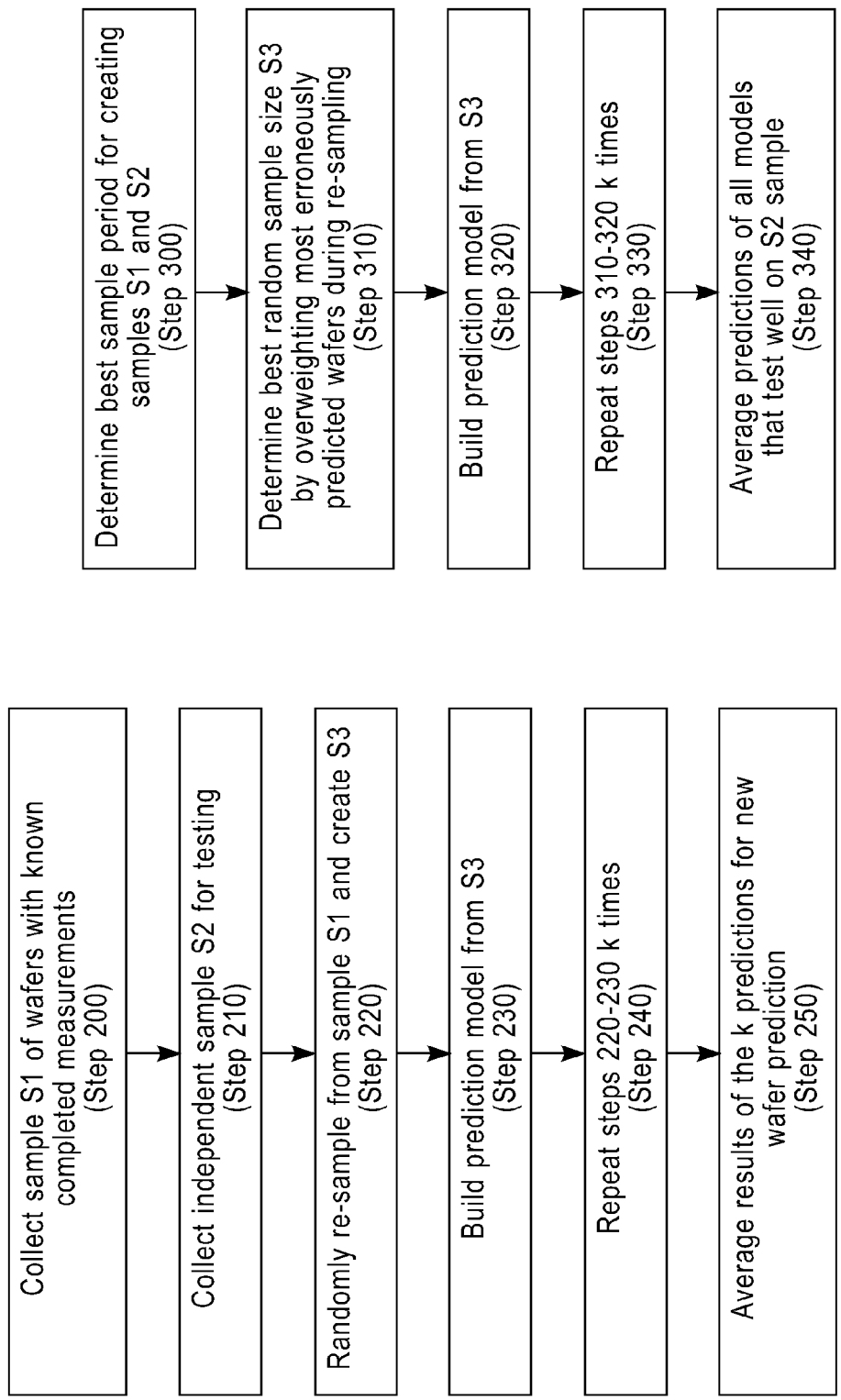
FIG. 2 is a flow chart that describes method steps for multistep prediction method in one embodiment.
FIG. 3 is a flow chart that describes method steps for customized boosted tree in one embodiment.

FIG. 2 is a flow chart that describes method steps of a multistep prediction method for predicting future measurements of the feature of the products being manufactured in one embodiment. At step 200, the computing system 600 collects a first set samples "S1" of products with known and complete feature measurements. At step 210, the computing system 600 collects a second set of independent samples "S2" of those products for testing, in a manner that ensures no overlap between the collected samples "S1" and "S2." At step 220, the computing system 600 randomly selects from the samples set "S1" and creates a further set of samples "S3." At step 230, the computing system 600 creates a computational model for predicting future measurements of those products from the further set of samples "S3." An example of a computational model created by using a linear regression technique, includes, but is not limited to: $wt(1) \times M(1) + \ldots + wt(j) M(j) = P(k)$, where j is the number of measurements, $wt()$ is a weight applied to each measurement, MO is a measurement value evaluated at a measurement time, $P(k)$ is a k-th product whose future measurement is predicted. Weights $wt()$ are found to minimize an error of the prediction. In one embodiment, the prediction error is estimated, e.g., by computing a mse (mean square error), or by computing a mad (mean absolute deviation) for the difference between a actual measurement "$T(j)$" and predicted measurement "$P(j)$."

Returning to FIG. 2, at step 240, the computing system 600 repeats steps 220-230 for k times such that there may be k number of computational models created. At step 250, the computing system 600 averages results of the k number of computational models. In one embodiment, the average of the k results is the predicted future measurement of the feature of the products being manufactured. Alternatively, the mean value of the k results is the predicted future measurement of the feature of the products being manufactured.

FIG. 3 is a flow chart that describes method steps of a customized boosted tree method for predicting future measurement of the feature of the products being manufactured in accordance with another embodiment. At step 300, the computing system 600 determines a sampling period for creating the samples of a set "S1" and samples of a set "S2," e.g., 90 days of semiconductor wafer production. At step 310, the computing system determines a number of samples for a further set of samples "S3." For example, the computing system 600 randomly selects the samples for set "S3," all of which are from the samples of set "S1." The number of the samples of set "S3" may be, for example, 10% of the number of the samples in set "S1." The samples of set "S3" includes samples of manufactured products whose predicted future measurements obtained, in step 250 in FIG. 2, were erroneous, i.e., the difference between the actual measurements and the predicted measurements is larger than a pre-determined threshold.

Returning to FIG. 3, at step 320, the computing system 600 creates a computation model from the samples set "S3," by using a known regression technique (e.g., linear regression, logistic regression, nonlinear regression, nonparametric regression, robust regression, stepwise regression, etc.) or a known machine learning technique (e.g., supervised learning, unsupervised learning, reinforcement learning, etc.). The created computational model includes, but is not limited to: a linear equation, a non-linear equation, a convex function, a non-convex function, etc. At step 330, the computing system 600 repeats steps 310-320 k times. At step 340, the computing system 600 averages results of all computational models that tested well on the samples "S2," i.e., the difference between those results and actual measurements of the samples "S2" is less than a pre-determined threshold. In one embodiment, the average of those results is the predicted future measurement of the feature of the products being manufactured. In another embodiment, the mean value of the results is the predicted future measurement of the feature of the products. The computing system 600 stores the predicted future measurement, e.g., in a database (not shown).

In one embodiment, the computing system 600 predicts the future measurements of the feature of the products being manufactured, e.g., based on the created computational model, before those products reach a certain manufacturing process step. In this embodiment, unless the computing system 600 performs predicting the future measurements of those products before that certain manufacturing process step, the computing system 600 may halt production of those products beyond that certain manufacturing process step. The computing system 600 may stop a manufacturing process step of those products until the computing system 600 receives, from sensors associated with that manufacturing process step, actual measurements of the feature of those products which are necessary to predict the future measurements of the feature of those products.

Returning to FIG. 1, step 120, the computing system 600 performs categorizing of the wafers according to their predicted feature measurements. In one embodiment, computing system 600 performs setting thresholds to categorize the product being manufactured as one of: a normal product (i.e., a predicted speed of the product complies with the product specification), a slow product (i.e., a predicted speed of the product is slower than a threshold) or a fast product (i.e., a predicted speed of the product is faster than a threshold). The system characterizes the product as the normal product, the slow product, or the fast product, according to the set thresholds. The system optimizes the setting of thresholds, e.g., by running method steps in FIGS. 4-5 which are described in detail below.

Figure 7:
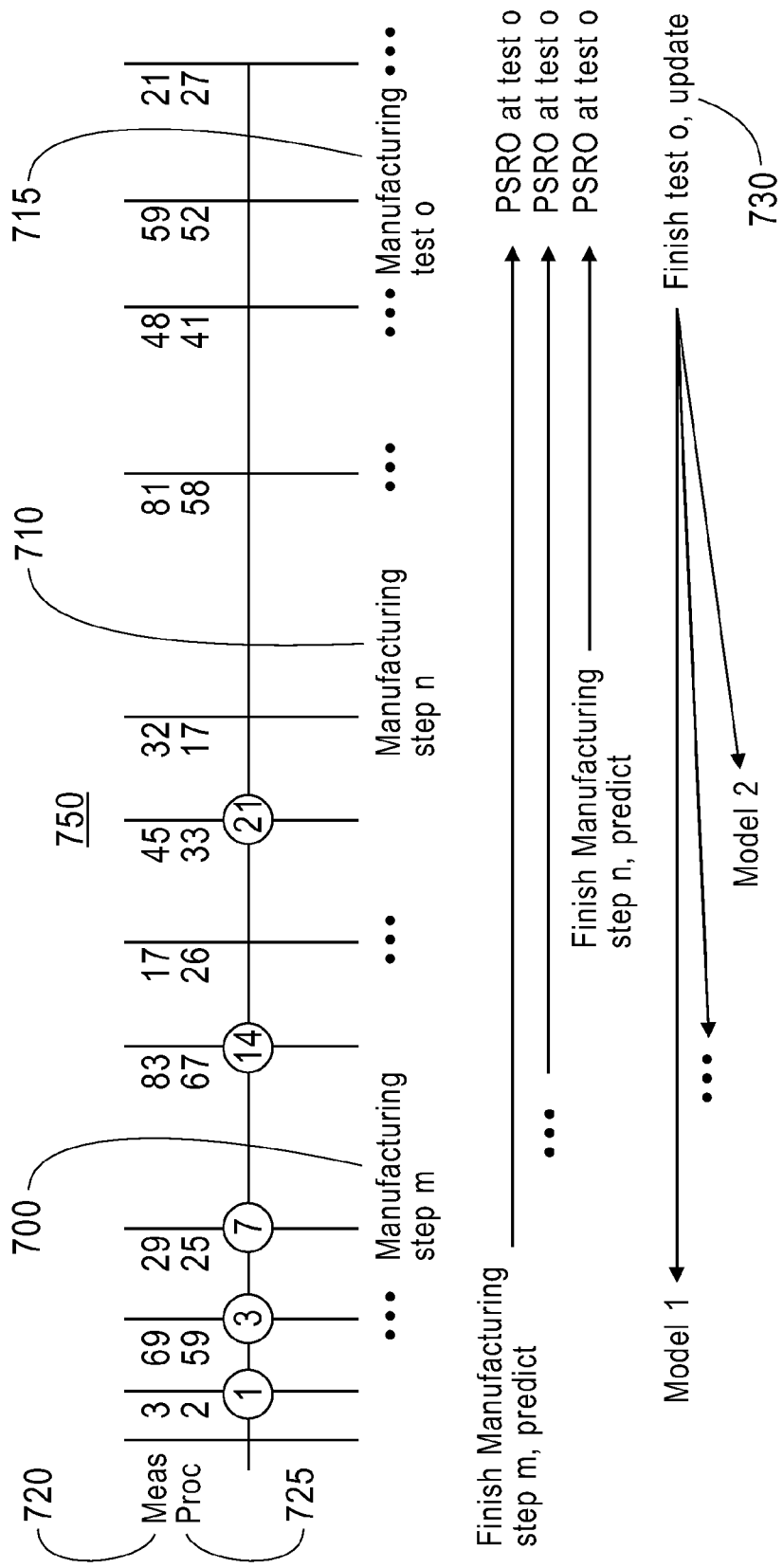
FIG. 7 illustrates an exemplary manufacturing process of a product in one embodiment.

Further, continuing at step 125, before the product reaches the certain manufacturing process step(s) (e.g., e.g., manufacturing step m (700) and/or manufacturing step n (710) shown in FIG. 7), or before the number of products being manufactured reaches a certain operation number, for example, 2280, 2070, etc., the computing system 600 notifies a user of the predicted future measurements of the product, e.g., by email, text, instant message, etc., if the product is characterized as the normal, slow product or the fast product.

FIG. 4a is a flow chart that describes method steps for determining a threshold to evaluate and predict based on the model results whether a product being manufactured is a fast product in one embodiment. At step 400, the computing system 600 builds a statistical model (e.g., the computational model created at step 230 in FIG. 2 or created at step 320 in FIG. 3, etc.) based on first samples of complete products. At step 405, the computing system 600 collects a separate test sample from those complete products. In one embodiment, the separate test sample may be collected from either earlier or later completed semiconductor chips or wafers. The first samples and test samples do not overlap each other. At step 410, by using the created statistical model and the test samples, the computing system predicts target measurements of the feature of the product being manufactured, e.g., as described in FIGS. 2-3. At step 415, for each product being manufactured, the computing system 600 computes prediction errors, e.g., by comparing those target measurements to actual measurements obtained from sensors in a manufacturing process step of the product.

At step 420, for a subset of products being manufactured whose prediction errors are computed larger than a pre-determined threshold, the computing system 600 computes a mse (mean square error) or mad (mean absolute deviation) value for that subset. At step 425, the computing system 600 computes mse (or mad) for the subset of those products whose predicted future measurements (e.g., predicted speeds, etc.) are above the mean value of the measurements of those first samples and/or test samples. At step 430, the computing system 600 computes mse (or mad) for the subset of those products whose predicted future measurements (e.g., predicted speeds, etc.) are below the mean value of the measurements of those first samples and/or test samples.

At step 435, the computing system 600 computes an accuracy rate according to: the number of products, among the subset of the products, whose actual measurements are actually above the mean value, divided by the number of products, among the subset of the products, whose predicted future measurements were above the mean value. At step 440, by using this computed accuracy rate, a user selects a threshold that can most accurately determine the fast product. In other words, the user selects the threshold that maximizes the accuracy rate. The user may also consider expected costs and yield rates when selecting the threshold to determine the fast product. The user can determine the threshold based on domain information (e.g., product specification, etc.).

In one embodiment, the computing system 600 runs method steps in FIG. 4b to determine a threshold to evaluate whether a product being manufactured is a slow product. In this embodiment, steps 450-470 in FIG. 4b are same as 400-420 in FIG. 4a. Steps 485-490 in FIG. 4b are same as steps 435-440 in FIG. 4a. However, at step 475, FIG. 4b, the computing system 600 computes mse (or mad) for the subset of those products whose predicted future measurements (e.g., predicted speeds, etc.) are below the mean value of the measurements of those first samples and/or test samples. At step 480, the computing system 600 then computes mse (or mad) for the subset of those products whose predicted future measurements (e.g., predicted speeds, etc.) are above the mean value of the measurements of those first samples and/or test samples. At step 485, the computing system 600 computes an accuracy rate according to: the number of products, among the subset of the products, whose actual measurements are actually below the mean value, divided by the number of products, among the subset of the products, whose predicted future measurements were below the mean value. At step 440, by using this computed accuracy rate, a user selects a threshold that can most accurately determine the slow product. In other words, the user selects the threshold that maximizes the accuracy rate.

FIG. 9 is an exemplary table 900 including data demonstrating an ability of the computing system 600 to accurately (e.g., more than 85% accuracy) categorize example products being manufactured as fast or slow products, e.g., by running method steps in FIGS. 4a-4b. For example, as shown in the table 900 in FIG. 9, regarding the test sample 1 (910), there was 86% (i.e., (150/174)×100%) accuracy when the computing system 600 categorizes products being manufactured as fast products. Regarding test sample 2 (920), there was 90% (i.e., 46/51×100%) accuracy when the when the computing system 600 categorizes products being manufactured as fast products. Regarding sample 3 (930), there was 91% (i.e., 71/77×100%) accuracy when the computing system 600 categorizes products being manufactured as fast products. An average measurement of a feature (e.g., speed, etc.) of test sample 1 was 13.02. An average measurement of a feature of test sample 2 was 13.17. An average measurement of a feature of high sample 3 wafers 940 (i.e., wafers, among sample 3, which are categorized as fast products) was 13.57.

FIG. 5 is a flow chart that describes method steps for determining a threshold to evaluate whether a product being manufactured is a normal product in one embodiment. The computing system 600 runs method steps 500-515 similarly as described herein with respect to the method steps 400-415 in FIG. 4a or steps 450-465 in FIG. 4b, which are described in detail above. At step 520, a user specifies a normal range (including upper and lower bounds) of a speed of the product being manufactured, e.g., based on a corresponding product specification. At step 525-530, the computing system 600 examines every possible range of the predicted future measurement of the product based on the test samples. The computing system 600 computes an accuracy ratio, e.g., according to the number of products, among the subset of products, whose actual measurements are within the normal range, divided by the number of products, among the subset of products, whose predicted future measurements are within the normal range. At step 535, the computing system 600 selects a range, among all the possible ranges, whose accuracy ratio is the best to minimize the prediction error. The selected range may cover a minimum number (e.g., 10 or 20, etc.) of those products being manufactured.

Upon characterizing the product being manufactured as a normal product, a fast product or the slow product, the computing system 600 notifies a manufacture of the product being manufactured, e.g., email, text, instant message, etc. Then, a user (e.g., a manufacturing/fabrication equipment operator, technician or engineer) may make an adjustment to the manufacturing process of the product being manufactured or make an adjustment to the product being manufactured in order to adjust fast or slow product(s) as normal product(s).

Returning to FIG. 1, at step 130, the computing system 600 updates the created computational model whenever the computing system receives a new measurement of the feature of the product being manufactured. Then, the computing system 600 updates the prediction of the future measurements of the at least one feature of the product, e.g., by running the updated computational model. In one embodiment, the computing system 600 updates the created computational model every pre-determined time period. In one embodiment, the computing system updates the prediction of the future measurements of the at least one feature of the product every pre-determined time period, e.g., by running the updated computational model.

FIG. 7 illustrates a diagram 750 depicting the updating of computation models in one embodiment. In FIG. 7, each manufacturing or test step may be associated with particular number of manufacturing or test processes and particular measurements obtained during the particular manufacturing or test processes. For example, the manufacturing step m is associated with "25" manufacturing processes, and "29" measurements per a product are obtained during the "25" manufacturing processes. In FIG. 7, there may a plurality of computational models to predict a future measurement of the feature of a product being manufactured. A manufacturing process step may be associated with at least one computation model (e.g., Model 1, or Model 2) that predicts a future measurement of a feature of a product being processed in that manufacturing process step. For example, according to FIG. 7, after a manufacturing process step n (700), the computing system 600 predicts the future measurement of the feature of the product being manufactured, e.g., based on a computational model 1. After a manufacturing process step m (710), the computing system 600 predicts the future measurement of the feature of the product being manufactured, e.g., based on a computational model 2. These predicted measurements are compared to actual measurements obtained at a test step o (715). Arrows from the manufacturing steps m and n to the test step o refer to manufacturing flows of products being manufactured. PSRO refers to a frequency measurement of Performance Sort Ring Oscillator in a product being manufactured. Based on these comparisons, the computational models (e.g., computational models 1-2) are updated 730 to reduce prediction errors. For example, if an original computation model is a linear equation, the original computation model may be updated to have a different slope and/or different constant term.

In one embodiment, the computing system determines a time interval in which the created computational model computes the future measurements of the feature of the product being manufactured with accuracy. Specifically, the computing system 600 compares accuracies of the computed future measurements at the two or more time intervals. The computing system 600 selects an interval whose accuracy is greatest among the two or more time intervals. For example, FIG. 10 is an exemplary table 1000 that demonstrates that the computing system 600 conducted future measurements predictions for a product feature at three different time intervals. In this example, in FIG. 10, the interval 3 (1005) may be the best time interval because by computing the future measurements of products being manufactured according to the interval 3 (1000), 45% of those future measurements were accurate.

In one embodiment, the computing system 600 performs the method steps in FIGS. 1-3 in real-time at one or more manufacturing process step. In one embodiment, the computing system 600 performs the method steps in FIGS. 4-5 in real-time. In one embodiment, the computing system 600 continuously predicts future measurements of products being manufactured throughout their manufacturing lifecycle, e.g., by running method steps in FIGS. 2-3.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for predicting at least one feature of at least one product being manufactured, the method comprising:
   receiving, from at least one sensor installed in at least one equipment performing one or more manufacturing process steps, at least one measurement of the at least one feature of the at least one product being manufactured;
   selecting one or more of the at least one received measurement of the at least one feature of the at least one product;
   estimating additional measurements of the at least one feature of the at least one product at a current manufacturing process step;
   creating a plurality of computational models for predicting future measurements of the at least one feature of the at least one product, based on the selected measurement and the estimated additional measurements;
   running the plurality of computational models;
   averaging results of the plurality of computational models, the average of the results representing the predicted future measurements of the at least one feature of the at least one product; and
   outputting the predicted future measurements of the at least one feature of the at least one product,
   wherein the step of receiving, the step of selecting, the step of estimating, the step of creating, the step of running, the step of averaging and the step of outputting are performed by a computing system that includes at least one memory device and at least one processor device connected to the memory device.

2. The method according to claim 1, wherein the at least one received measurement of the at least one feature of the at least one product includes one or more of:
   a speed measurement of the at least one product, a power consumption measurement of the at least one product, a yield rate measurement of the at least one product, a leakage current measurement of the at least one product, an area measurement of the at least one product, a capacitance measurement of the at least one product, and a resistance measurement of the at least one product.

3. The method according to claim 1, wherein the at least one product being manufactured includes one or more of: a semiconductor chip, a semiconductor wafer, and a semiconductor wafer lot.

4. The method according to claim 1, further comprising:
   obtaining estimates of the additional measurements of the at least one feature of the at least one product by computing average values or mean values of the at least one received measurement of the at least one feature of other similar or same products.

5. The method according to claim 1, wherein the step of creating the computational model includes:
   applying a regression technique or machine learning technique to the selected measurement and the estimated additional measurements.

6. The method according to claim 1, wherein the computing system performs the step of receiving, the step of selecting, the step of estimating, the step of creating, the step of averaging, the step of running, the step of averaging, and the step of outputting, in real-time at one or more manufacturing process step.

7. The method according to claim 2, further comprising:
   setting thresholds for distinguishing a normal product, a slow product or a fast product;
   characterizing the product as the normal product, the slow product, or the fast product, according to the set thresholds;
   optimizing the step of setting and the step of characterizing; and
   notifying a user of the predicted future measurements of the product, if the product is characterized as the slow product or the fast product.

8. The method according to claim 1, further comprising:
   updating the created computational models whenever the computing system receives a new measurement of the at least one feature of the at least one product; and
   updating the prediction of the future measurements of the at least one feature of the product according to the updated computational models.

9. The method according to claim 1, further comprising:
   updating the created computational models every pre-determined time period; and
   updating the prediction of the future measurements of the at least one feature of the product every the pre-determined time period according to the updated computational models.

10. The method according to claim 1, further comprising:
    storing the predicted future measurements of the at least one feature of the at least one product and the at least one received measurement of the at least one feature of the at least one product in a database.

11. The method according to claim 1, further comprising:
    evaluating quality of the at least one received measurement by applying at least one statistical test on the at least one received measurement.

12. The method according to claim 1, further comprising:
    determining a time interval in which the created computational models computes the future measurements of the at least one feature of the at least one product with accuracy.

13. The method according to claim 12, wherein the step of determining further comprises:
    comparing two or more time intervals in which the created computational models compute the future measurements;
    comparing accuracies of the computed future measurements of the two or more time intervals; and
    selecting an interval whose accuracy is greatest among the two or more time intervals.

14. A system for predicting at least one feature of at least one product being manufactured, the system comprising:
- at least one memory device; and
- at least one processor, wherein the processor is configured to receive, from at least one sensor installed in at least one equipment performing one or more manufacturing process steps, at least one measurement of the at least one feature of the at least one product being manufactured;
- select one or more of the at least one received measurement of the at least one feature of the at least one product;
- estimate additional measurements of the at least one feature of the at least one product at a current manufacturing process step;
- create a plurality of computational models for predicting future measurements of the at least one feature of the at least one product, based on the selected measurement and the estimated additional measurements;
- run the plurality of computational models;
- average results of the plurality of computational models, the average of the results representing the predicted future measurements of the least one feature of the at least one product; and
- output the predicted future measurements of the at least one feature of the at least one product.

15. The system according to claim 14, wherein the at least one received measurement of the at least one feature of the at least one product includes one or more of:
- a speed measurement of the at least one product, a power consumption measurement of the at least one product, a yield rate measurement of the at least one product, a leakage current measurement of the at least one product, an area measurement of the at least one product, a capacitance measurement of the at least one product, and a resistance measurement of the at least one product.

16. The system according to claim 14, wherein the at least one product being manufactured includes one or more of:
- a semiconductor chip, a semiconductor wafer, and a semiconductor wafer lot.

17. The system according to claim 14, wherein the processor is further configured to:
- obtain estimates of the additional measurements of the at least one feature of the at least one product by computing average values or mean values of the at least one received measurement of the at least one feature of other similar or same products.

18. The system according to claim 14, wherein to create the computational models, the processor is configured to:
- apply a regression technique or machine learning technique to the selected measurement and the estimated additional measurements.

19. The system according to claim 15, wherein the processor is further configured to:
- set thresholds for distinguishing a normal product, a slow product or a fast product;
- characterize the product as the normal product, the slow product, or the fast product, according to the set thresholds;
- optimize the step of setting and the step of characterizing; and
- notify a user of the predicted future measurements of the product, if the product is characterized as the slow product or the fast product.

20. The system according to claim 14, wherein the processor is further configured to:
- update the created computational models whenever the computing system receives a new measurement of the product; and
- updating the prediction of the future measurements of the at least one feature of the product according to the updated computational models.

21. The system according to claim 14, wherein the processor is further configured to:
- update the created computational models every pre-determined time period; and
- updating the prediction of the future measurements of the at least one feature of the product every the pre-determined time period according to the updated computational models.

22. The system according to claim 14, wherein the processor is further configured to:
- store the predicted future measurements of the at least one feature of the at least one product and the at least one received measurement of the at least one feature of the at least one product in a database.

23. The system according to claim 14, wherein the processor is further configured to:
- evaluate quality of the at least one received measurement by applying at least one statistical test on the at least one received measurement.

24. A computer program product for predicting at least one feature of at least one product being manufactured, the computer program product comprising:
- a non-transitory storage medium readable by a processing circuit and storing instructions run by the processing circuit for performing a method, the method comprising:
- receiving, from at least one sensor installed in at least one equipment performing one or more manufacturing process steps, at least one measurement of the at least one feature of the at least one product being manufactured;
- selecting one or more of the at least one received measurement of the at least one feature of the at least one product;
- estimating additional measurements of the at least one product at a current manufacturing process step;
- creating a plurality of computational models for predicting future measurements of the at least one feature of the at least one product, based on the selected measurement and the estimated additional measurements;
- running the plurality of computational models;
- averaging results of the plurality of computational models, the average of the results representing the predicted future measurements of the at least one feature of the product; and
- outputting the predicted future measurements of the at least one feature of the at least one product,
- wherein the processing circuit coupled to the non-transitory storage medium is configured to perform: the receiving, the selecting, the estimating, the creating, the running, the averaging, and the outputting.

25. The computer program product according to claim 24, wherein the at least one received measurement of the at least one feature of the at least one product includes one or more of:
- a speed measurement of the at least one product, a power consumption measurement of the at least one product, a yield rate measurement of the at least one product, a leakage current measurement of the at least one product, an area measurement of the at least one product, a capacitance measurement of the at least one product, and a resistance measurement of the at least one product.

* * * * *